US012639832B2

(12) United States Patent
Wang

(10) Patent No.: US 12,639,832 B2
(45) Date of Patent: May 26, 2026

(54) SIMULATION-ASSISTED METROLOGY IMAGE ALIGNMENT

(71) Applicant: ASML NETHERLANDS B.V., Veldhoven (NL)

(72) Inventor: Te-Sheng Wang, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 443 days.

(21) Appl. No.: 18/035,233

(22) PCT Filed: Oct. 19, 2021

(86) PCT No.: PCT/EP2021/078870
§ 371 (c)(1),
(2) Date: May 3, 2023

(87) PCT Pub. No.: WO2022/106132
PCT Pub. Date: May 27, 2022

(65) Prior Publication Data
US 2023/0401727 A1 Dec. 14, 2023

Related U.S. Application Data

(60) Provisional application No. 63/116,385, filed on Nov. 20, 2020.

(51) Int. Cl.
*G03F 7/00* (2006.01)
*G03F 9/00* (2006.01)
(Continued)

(52) U.S. Cl.
CPC .............. *G06T 7/33* (2017.01); *G03F 7/705* (2013.01); *G03F 9/7042* (2013.01); *G06T 7/001* (2013.01); *G06T 2207/30148* (2013.01)

(58) Field of Classification Search
CPC . G06T 7/33; G06T 7/001; G06T 2207/30148; G03F 7/705; G03F 9/7042;
(Continued)

(56) References Cited

U.S. PATENT DOCUMENTS

| | | | |
|---|---|---|---|
| 7,587,704 B2 | 9/2009 | Ye et al. | |
| 2008/0183323 A1* | 7/2008 | Menadeva | G06T 7/12 |
| | | | 700/109 |

(Continued)

FOREIGN PATENT DOCUMENTS

| | | |
|---|---|---|
| TW | 202001446 | 1/2020 |
| WO | 2018121965 | 7/2018 |

OTHER PUBLICATIONS

International Search Report and Written Opinion issued in corresponding PCT Patent Application No. PCT/EP2021/078870, dated Jan. 26, 2022.

*Primary Examiner* — Sheela C Chawan
(74) *Attorney, Agent, or Firm* — Pillsbury Winthrop Shaw Pittman LLP

(57) ABSTRACT

A method for aligning a measured image of a pattern printed on a substrate with a design layout. The method includes: obtaining a design layout of a pattern to be printed on a substrate and a measured image of the pattern printed on the substrate; performing a simulation process to generate a plurality of simulated contours of the design layout for a plurality of process conditions of a patterning process; identifying a set of disfavored locations based on the simulated contours; and performing an image alignment process to align the measured image with a selected contour of the simulated contours using locations other than the set of disfavored locations.

20 Claims, 11 Drawing Sheets

(51) Int. Cl.
*G06T 7/00* (2017.01)
*G06T 7/33* (2017.01)
(58) Field of Classification Search
CPC ............. G03F 7/70441; G03F 7/70616; G03F
7/70433
USPC .................................................. 382/100, 141
See application file for complete search history.

(56) References Cited

U.S. PATENT DOCUMENTS

| 2010/0023916 A1* | 1/2010 | Chew .................... G06F 30/398 |
| | | 716/53 |
| 2018/0053291 A1* | 2/2018 | Ma ........................... G06T 11/00 |
| 2018/0293721 A1* | 10/2018 | Gupta .................... G06N 3/045 |
| 2020/0089122 A1* | 3/2020 | Wang ..................... G03F 7/705 |
| 2020/0301289 A1* | 9/2020 | Jheng ........................ G03F 1/70 |
| 2021/0208507 A1 | 7/2021 | Wang et al. |

\* cited by examiner

605

705

715

SIMULATION-ASSISTED METROLOGY IMAGE ALIGNMENT

CROSS-REFERENCE TO RELATED APPLICATIONS

This application is the U.S. national phase entry of PCT Patent Application No. PCT/EP2021/078870 which was filed on Oct. 19, 2021, which claims priority of U.S. Provisional Patent Application No. 63/116,385 which was filed on Nov. 20, 2020 and which is incorporated herein in its entirety by reference.

TECHNICAL FIELD

The present disclosure relates to a method and apparatus for measuring patterns formed by a patterning process on a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices. In that instance, a patterning device, which is alternatively referred to as a mask or a reticle, may be used to generate a pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor one or more steps of a patterning process (i.e., a process of device manufacturing involving lithography, including, e.g., resist-processing, etching, development, baking, etc.), the patterned substrate is inspected and one or more parameters of the patterned substrate are determined. The one or more parameters may include, for example, edge placement errors (EPEs), which are distances between edges of patterns formed on the substrate and corresponding edges of the intended design of the patterns. This measurement may be performed on patterns of the product substrate itself and/or on a dedicated metrology target provided on the substrate. There are various techniques for making measurements of the microscopic structures formed in a patterning process, including the use of a scanning electron microscope (SEM) and/or various specialized tools.

SUMMARY

In an aspect, there is provided a non-transitory computer-readable medium having instructions that, when executed by a computer, cause the computer to execute a method for aligning a measured image of a pattern printed on a substrate with a design layout. The method includes: obtaining a design layout of a pattern to be printed on a substrate and a measured image of the pattern printed on the substrate; performing a simulation process to generate simulated contours of the design layout for a plurality of process conditions of a patterning process; identifying a set of disfavored locations based on the simulated contours; and performing an image alignment process to align the measured image with a selected contour of the simulated contours using locations other than the set of disfavored locations In an aspect, there is provided a non-transitory computer-readable medium having instructions that, when executed by a computer, cause the computer to execute a method for aligning a measured image of a pattern printed on a substrate with a design layout. The method includes: obtaining a design layout of a pattern to be printed on a substrate and a measured image of the pattern printed on the substrate; performing a simulation process to generate a plurality of simulated results of the design layout for a plurality of process conditions of a patterning process; identifying a set of disfavored locations based on the simulated results; and performing an image alignment process between the measured image and the design layout by aligning the measured image with a selected result of the simulated results using locations other than the set of disfavored locations.

In an aspect, there is provided a non-transitory computer-readable medium having instructions that, when executed by a computer, cause the computer to execute a method for aligning a measured image of a pattern printed on a substrate with a design layout. The method includes: obtaining a design layout of a pattern to be printed on a substrate and a measured image of the pattern printed on the substrate; performing a simulation process to generate simulated contours of the design layout for a plurality of process conditions of a patterning process; identifying a set of disfavored locations based on the simulated contours; performing a simulation process to generate a predicted measured image from a selected contour of the simulated contours; and performing an image alignment process to align the measured image with the predicted measured image using locations other than the set of disfavored locations.

In an aspect, there is provided a method for aligning a measured image of a pattern printed on a substrate with a design layout. The method includes: obtaining a design layout of a pattern to be printed on a substrate and a measured image of the pattern printed on the substrate; performing a simulation process to generate a plurality of simulated contours of the design layout for a plurality of process conditions of a patterning process; identifying a set of disfavored locations based on the simulated contours; and performing an image alignment process to align the measured image with a selected contour of the simulated contours using locations other than the set of disfavored locations.

In an aspect, there is provided an apparatus for aligning a measured image of a pattern printed on a substrate with a design layout. The apparatus includes: a memory storing a set of instructions; and at least one processor configured to execute the set of instructions to cause the apparatus to perform a method of: obtaining a design layout of a pattern to be printed on a substrate and a measured image of the pattern printed on the substrate; performing a simulation process to generate a plurality of simulated contours of the design layout for a plurality of process conditions of a patterning process; identifying a set of disfavored locations based on the simulated contours; and performing an image alignment process to align the measured image with a selected contour of the simulated contours using locations other than the set of disfavored locations.

DETAILED DESCRIPTION

Figures 1, 2:
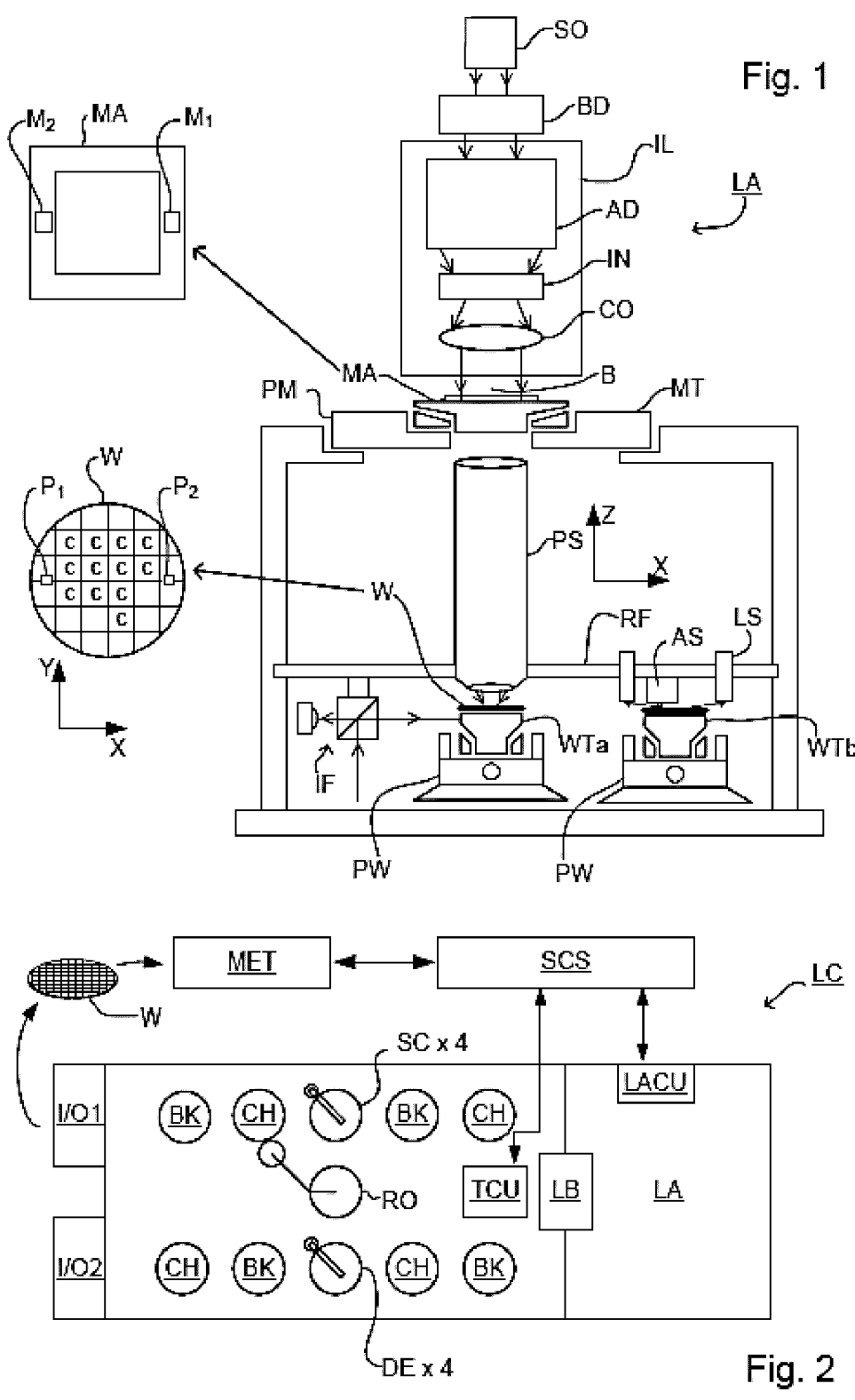
FIG. 1 schematically depicts an embodiment of a lithographic apparatus, in accordance with one or more embodiments.
FIG. 2 schematically depicts an embodiment of a lithographic cell or cluster, in accordance with one or more embodiments.

In order to monitor one or more steps of a patterning process (i.e., a process of device manufacturing involving lithography, including, e.g., resist-processing, etching, development, baking, etc. for transferring a design layout (e.g., target pattern) onto a substrate), a patterned substrate is inspected and one or more parameters of the patterned substrate are determined. The one or more parameters may include, for example, edge placement errors (EPEs), which are distances between edges of patterns formed on the substrate and corresponding edges of the intended design of the patterns. Based on these parameters, one or more aspects of the design layout, the patterning process, or the lithographic apparatus may be adjusted to minimize a defect and therefore, improve the overall yield of the patterning process.

Some inspection methods for determining one or more parameters of a patterned substrate include a simulation-assisted alignment method in which a measured image (also referred to as a "metrology image" and may be an image of a pattern printed on a substrate, such as a scanning electron microscope (SEM) image) is aligned with a design layout (e.g., target pattern to be printed on the substrate) to determine the one or more parameters. In the simulation-assisted alignment method, the metrology image is aligned with a simulated contour of the design layout to determine the one or more parameters. However, these methods have some drawbacks. For example, while these methods avoid performing alignment at reference locations that may be prone to large EPE, they do not consider factors other than EPE in choosing or not choosing the reference locations for performing the alignment causing the alignment to be sub-optimal, which may result in the values of the one or more parameters being inaccurate. In another example, these methods do not consider process variations of the patterning process (e.g., lens effect of the lithographic apparatus, resist effect of a resist on the substrate, or other such variations) in generating the simulated contours, which may result in sub-optimal alignments. In another example, these methods do not consider resizing the simulated contour to match the contour from the metrology image, which may result in sub-optimal alignment. In another example, these methods do not facilitate generating a simulated metrology image and performing an alignment between the simulated metrology image and the metrology image. These and other drawbacks exist.

Embodiments of the present disclosure facilitate alignment of a metrology image and a simulated contour by identifying a set of "favored" locations associated with a design layout to be used for performing the alignment with the metrology image and a set of "disfavored" locations to be avoided from being used for performing the alignment. In some embodiments, the alignment may be performed substantially concurrent with metrology image capturing on an inspection tool. The embodiments may perform the alignment of the design layout with the metrology image at locations other than the set of disfavored locations. In some embodiments, the favored or disfavored locations are identified based one or more criteria, such as EPE, process variation range, symmetricity, or other such aspects associated with a location on the design layout. For example, the embodiments may identify those locations as disfavored locations at which (a) a number of simulated contours of the design layout have a process variation range exceeding a first threshold, (b) the simulated contours have an EPE exceeding a second threshold, (c) the simulated contours are asymmetric, or (d) one or more simulated contours are broken. In some embodiments, a user may customize the criteria for selecting the disfavored locations. The embodiments may also facilitate in resizing a simulated contour of the design layout at one or more favored locations to match the contour from the metrology image to further improve an accuracy of the alignment. The embodiments may also facilitate generating a simulated metrology image from the simulated contour and performing an alignment between the simulated metrology image and the metrology image.

Before describing embodiments in detail, it is instructive to present an example environment in which embodiments may be implemented.

FIG. 1 schematically depicts a lithographic apparatus LA, in accordance with one or more embodiments. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is patterned by the lithographic apparatus is done so correctly and consistently, it is desirable to inspect a patterned substrate to measure one or more properties such as EPEs, line thickness, critical dimension (CD), etc. Accordingly, a manufacturing facility in which the lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to patterning of a subsequent substrate (especially if the inspection can be done soon and fast enough that one or more other substrates of the batch are still to be patterned) and/or to subsequent patterning of the patterned substrate. Also, an already patterned substrate may be stripped and reworked to improve yield, or discarded, thereby avoiding performing further processing on a substrate known to be faulty. In a case where only some target portions of a substrate are faulty, further patterning may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithocell LC or may be a stand-alone device. To enable rapid measurement, it is desirable that the inspection apparatus measures one or more properties in the patterned resist layer immediately after the patterning. However, for example, a latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

The inspection of a substrate patterned in a patterning process may involve capturing images (e.g., scanning electron microscopy images) of the substrate. Some parameters of the patterned substrate may be extracted from the images alone but other parameters may require comparison with other data, such as the design layout of the patterns formed on the substrate.

Comparing the design layout to an image is not always straightforward. The image may have to be aligned to the design layout before the comparison. Errors in the alignment may lead to errors in the parameters of the patterned substrate measured by the metrology system.

Figure 3:
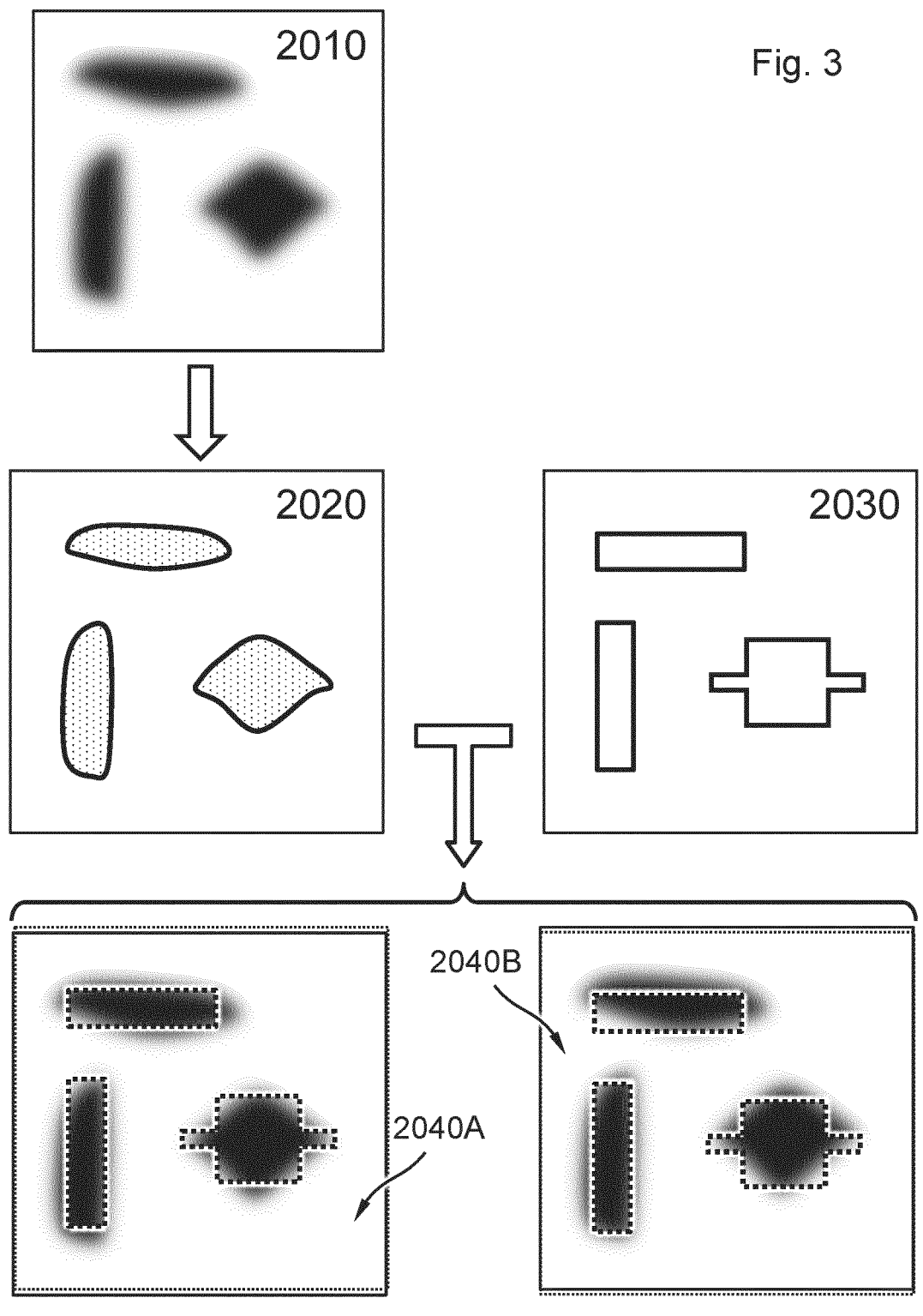
FIG. 3 schematically shows a process of aligning an image to a portion of a design layout, in accordance with one or more embodiments.

FIG. 3 schematically shows a process of aligning an image to a portion of a design layout, in accordance with one or more embodiments. An image 2010 is obtained, for example, from an image capture device, e.g., an inspection apparatus of the metrology system. The image 2010 may be a metrology image of patterns formed on a substrate from the portion of the design layout using a patterning process. The image 2010 may be a pixelated image such as a SEM image Contours 2020 may be identified from the image 2010, using a suitable edge detection algorithm. The contours 2020 represent the edges of the patterns on the substrate. The contours 2020 and the portion of the design layout 2030 are used to determine a mapping between the portion of the design layout 2030 and the image 2010 for aligning the portion of the design layout 2030 and the image 2010. The word "mapping" here may represent relative translation, relative rotation, relative scaling, relative skewing or other relative deformation, which may be applied to the image 2010 before the image 2010 and the portion of the design layout 2030 are aligned. There may be multiple mappings that are all reasonable, which result in multiple different alignments (e.g., 2040A and 2040B) of the portion of the design layout 2030 and the image 2010. In the different alignments, the parameters of the patterned substrate measured by the metrology system may have different values.

There may be multiple ways to use the contours 2020 and the portion of the design layout 2030 to determine the mapping between them. For example, a cost function may be defined to characterize deviations of corresponding mapping references (e.g., edges, corners) in the contours 2020 and in the portion of the design layout 2030. The term "mapping reference" as used herein means a portion of a design layout or of an image, based on which the mapping between the design layout and the image is determined. In an example, the cost function may be expressed as $$CF(m) = \sum_{p=1}^{P} w_p f_p^2(m) \qquad \text{(Eq. 1)}$$

wherein m is the mapping and $f_p(m)$ can be a function of the mapping m. For example, $f_p(m)$ can be a deviation between a mapping reference in the contours 2020 and a corresponding mapping reference in the portion of the design layout 2030. The deviation here may include relative translation, relative rotation, relative scaling, relative skewing or other relative deformation. $w_p$ is a weight constant associated with $f_p(m)$. EPE is one example of $f_p(m)$. Different $f_p(m)$ may have equal weight $w_p$, especially when there is no reason to favor some $f_p(m)$ relative to others. Of course, CF(m) is not limited to the form in Eq. 1. CF(m) can be in any other suitable form. The mapping m may be one that minimizes or maximizes the cost function CF(m).

Not all of the mapping references of the design layout may be produced on a substrate with equal accuracy by a patterning process. Some of the mapping references of the design layout may have large deviations from the corresponding mapping references of the patterns produced on the substrate. The deviations may have multiple origins. One origin can be a resolution enhance technique (RET). In order to accurately produce patterns with dimensions smaller than the classical resolution limit of a lithographic projection apparatus, sophisticated fine-tuning steps may be applied to the lithographic projection apparatus and/or the design layout. RETs may include, for example, but not limited to, optimization of NA and optical coherence settings, customized illumination schemes, use of assist features, use of phase shifting patterning devices, optical proximity correction (OPC) in the design layout, etc. RETs may not be perfect and may contribute to the deviations.

Another origin can be inaccuracy of the patterning device (sometimes called "mask errors"). After the design layout is modified by a RET, it can be formed on or by a patterning device. This process may have errors. Namely, a pattern as a result of a RET may not be accurately formed on or by the patterning device. For example, a pattern formed on or by the patterning device may have a deformation such as a translation of edges of the pattern, a translation of the pattern, a rotation of edges of the pattern, scaling of the pattern, and/or skewing of the pattern, relative to the design layout or the post-RET layout.

Yet another origin can be the patterning process, including a lithographic projection apparatus used therein. The patterning process may have various errors. Examples of errors may include that the resist used on the substrate has a development rate higher than normal, that a radiation source output is lower than normal, that a component in the projection optics is deformed due to heating, and/or a stochastic effect of photon shot noise.

At least a portion of a deviation between a mapping reference of the design layout and the corresponding mapping reference of the pattern produced on the substrate may be determined based on simulation and characteristics of the patterning process (including the lithographic apparatus) and the design layout. The simulation may provide information that can be used to determine the mapping between a metrology image (e.g., image 2010) and the design layout (e.g., the portion 2030).

Figure 4:
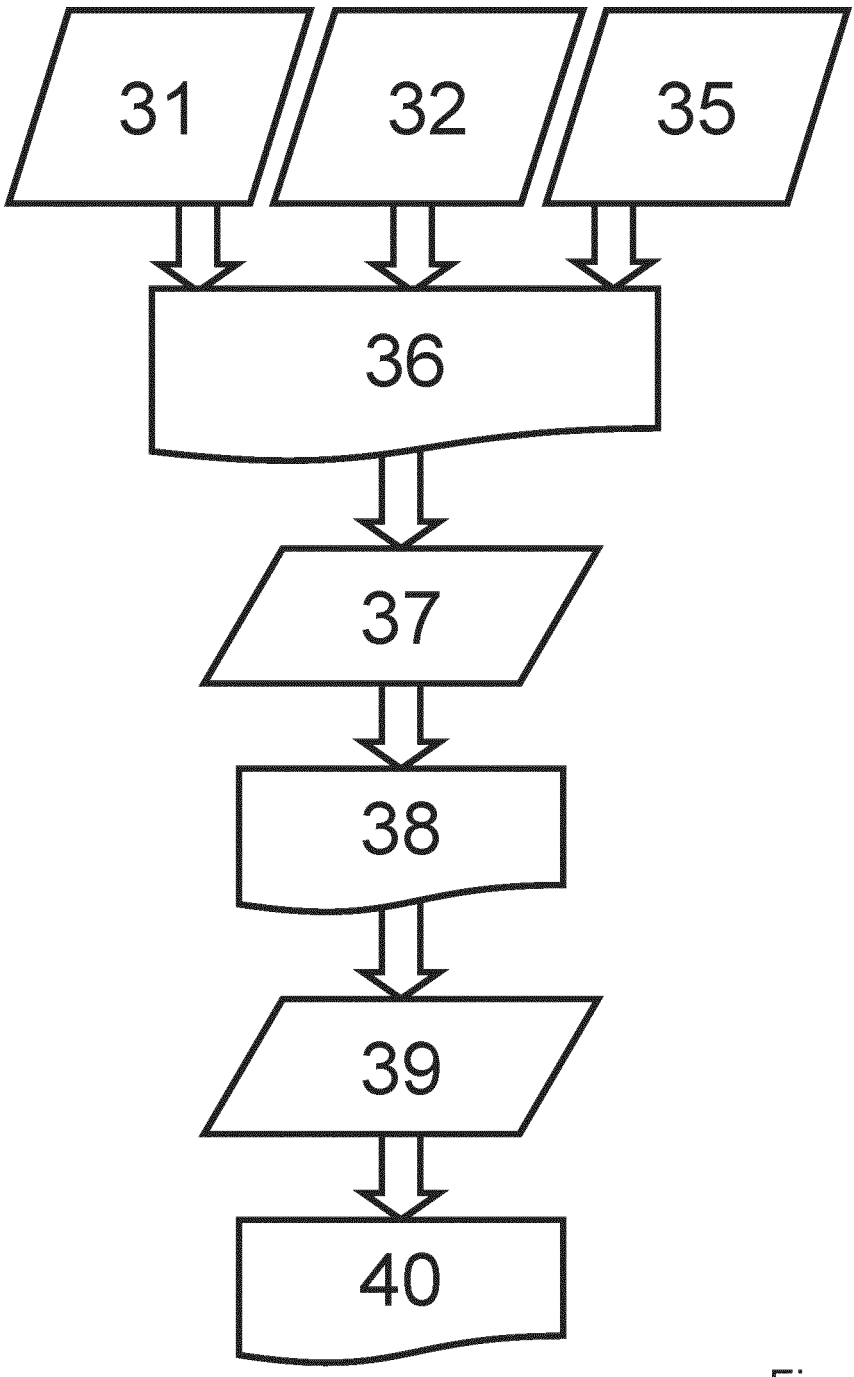
FIG. 4 schematically shows a simulation flow chart, in accordance with one or more embodiments.

FIG. 4 schematically shows a simulation flow chart, in accordance with one or more embodiments. A source model 31 represents one or more optical characteristics (including radiation intensity distribution and/or phase distribution) of illumination. A projection optics model 32 represents one or more optical characteristics (including changes to the radiation intensity distribution and/or the phase distribution caused by the projection optics) of the projection optics. A patterning device model 35 represents one or more optical characteristics of the patterning device (including changes to the radiation intensity distribution and/or the phase distribution caused by a given design layout represented on the patterning device). An aerial image 36 can be simulated from the source model 31, the projection optics model 32 and the patterning device model 35. A resist image 38 can be simulated from the aerial image 36 using a resist model 37. The resist model 37 represents physical and chemical properties of the resist (e.g., behavior of the resist in exposure, post exposure bake and development). An etch image 40 can be simulated from the resist image 38 using an etching model 39. The etching model 39 represents characteristics of the etching process of the substrate.

More specifically, the source model 31 can represent one or more optical characteristics of the illumination including, but not limited to, a numerical aperture setting, an illumination sigma ($\sigma$) setting and/or a particular illumination shape (e.g. off-axis illumination such as annular, quadrupole, dipole, etc.). The projection optics model 32 can represent one or more optical characteristics of the projection optics, including aberration, distortion, one or more refractive indices, one or more physical sizes, one or more physical dimensions, etc. The patterning device model 35 can represent one or more physical properties of a physical patterning device, as described, for example, in U.S. Pat. No. 7,587,704, which is incorporated by reference in its entirety. The etching model 39 can represent one or more characteristics of the etching process such as gas composition, (microwave) power, duration, one or more materials of the substrate, etc.

The source model 31, the projection optics model 32, the patterning device model 35, and the etching model 39 may model contributions of the patterning process to deviations of the aerial, resist or etched image from the design layout. The patterning device model 35 may model the contribution of the RETs and inaccuracy of the patterning device to deviations of the aerial, resist or etched image from the design layout. The various models may be calibrated at least partially from experimental data.

The simulation may or may not simulate an aerial, resist or etched image. In the latter case, it can generate one or more various characteristics thereof. For example, the simulation may simulate one or more geometrical characteristics (position, orientation, or size) of a mapping reference in the aerial, resist or etched image.

The simulation can provide information about the deviation of one or more mapping references of a pattern produced on the substrate relative to the design layout. The one or more mapping references that have large deviations from the design layout as predicted by the simulation may negative impact the alignment of a metrology image (e.g., image 2010) and the design layout (e.g., the portion 2030) and are given less or zero weight according to embodiments of the present disclosure.

Figure 5:
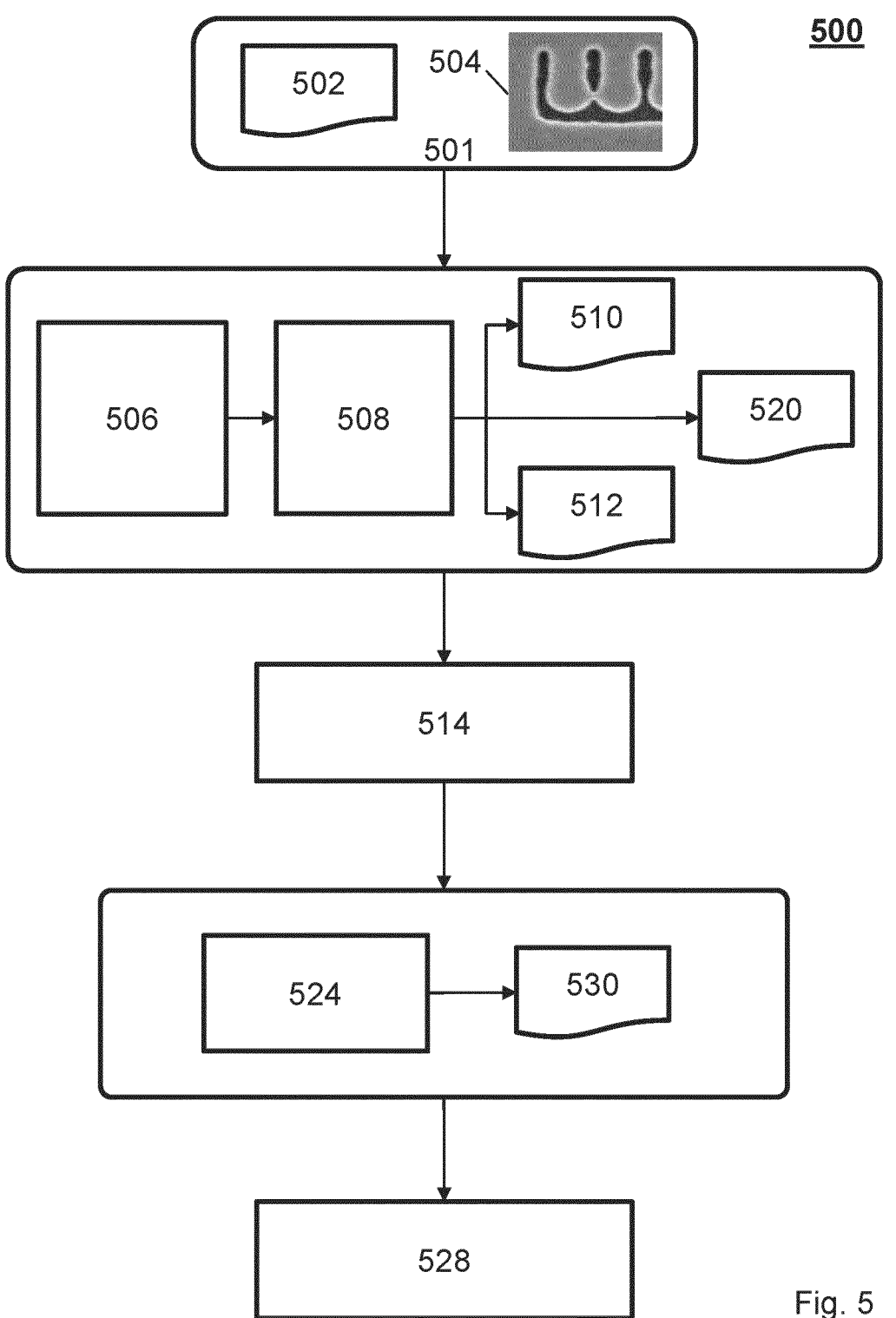
FIG. 5 shows a block diagram of a system for facilitating a simulation-assisted alignment of a metrology image with a design layout, in accordance with one or more embodiments.

FIG. 5 shows a block diagram of a system 500 for facilitating a simulation-assisted alignment of a metrology image with a design layout, in accordance with one or more embodiments. A file component 501 obtains a design layout 502 (or a portion thereof) and a measured image 504 (also referred to as "metrology image 504"). The design layout 502 may be representative of a target pattern to be printed on a substrate, and the metrology image 504 may be an image of a pattern formed on the substrate from the portion of the design layout 502. The metrology image 504 may be a SEM image, which may be obtained from an inspection apparatus, such as the SEM, of the metrology system of FIG. 2. In some embodiments, the design layout 502 is obtained from Graphic Database Systems (GDS) polygons associated with the target pattern. The GDS polygons can be in one or more formats selected from GDS stream format (GDSII) and Open Artwork System Interchange Standard (OASIS). In some embodiments, the design layout 502 is similar to the design layout 2030, and the metrology image 504 may be similar to the image 2010 of FIG. 3, respectively.

Figure 6:
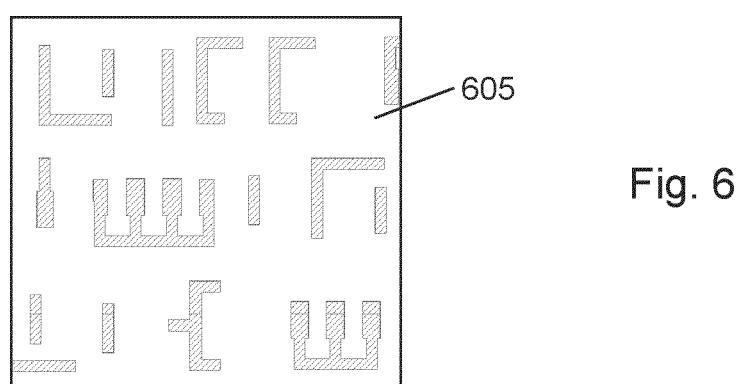
FIG. 6 shows an example of a post-resolution enhancement technique design layout, in accordance with one or more embodiments.

After the design layout 502 is obtained, a RET (e.g., OPC) may be performed on the design layout 502, which changes the design layout 502 to a post-RET layout, such as the post-RET layout 605 of FIG. 6. FIG. 6 shows an example of a post-RET design layout 605, in accordance with one or more embodiments. In some embodiments, RET may alter some of the patterns and add assist features to the design layout 502.

Figure 7:
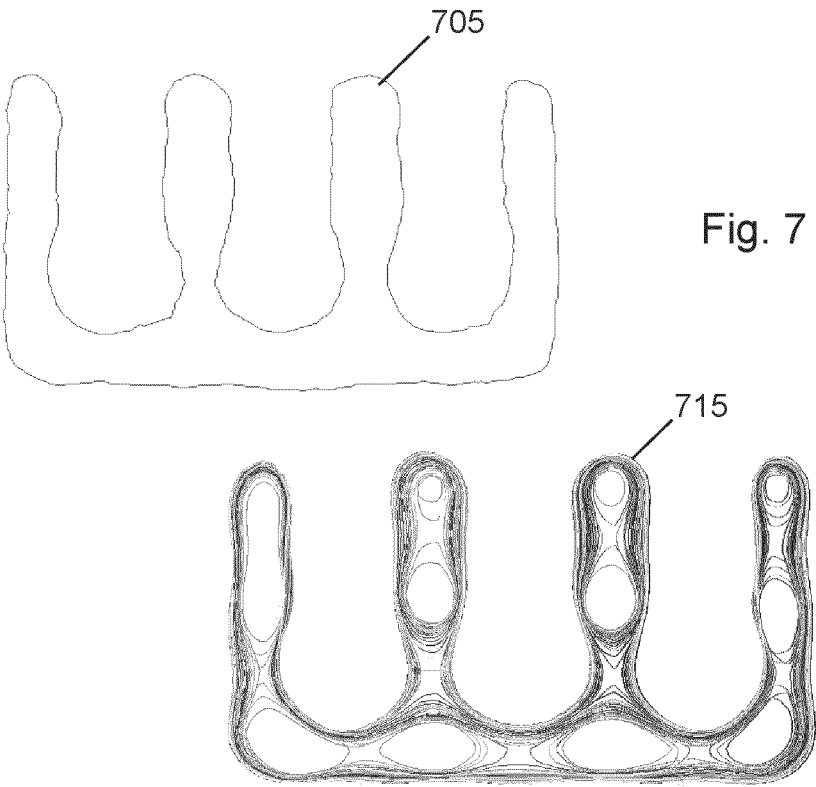
FIG. 7 shows an example of simulated contours corresponding to various process conditions, in accordance with one or more embodiments.

A contour simulator 506 may produce a simulated contour, such as the simulated contour 705 of FIG. 7, based on the design layout 502 or the post-RET layout 605. FIG. 7 shows an example of simulated contours 715 corresponding to various process conditions, in accordance with one or more embodiments. In some embodiments, the contour simulator 506 may generate a simulated contour 705 using the simulation process described at least with reference to FIG. 4. In some embodiments, a number of process conditions, such as a lens effect (e.g., dose, focus, lens aberration, or other conditions) of the lithographic apparatus, a resist effect of a resist on the substrate, or other such process conditions, may have an effect on the formation of a pattern on the substrate. Accordingly, the contour simulator 506 may generate a number of simulated contours 715 for a given target pattern, each corresponding to a different process condition.

In some embodiments, the metrology image 504 may be aligned with the design layout 502 by aligning the metrology image 504 (or contours generated from the metrology image 504) with a selected contour 520 of the design layout 502. In some embodiments, the selected contour 520 is one of the simulated contours 715 of the design layout 502 that corresponds to a specific process condition, e.g., a nominal process condition.

A contour analyzer 508 may analyze the simulated contours 715 to identify a set of "favored" locations 510 and a set of "disfavored" locations 512 for use in an alignment process. In some embodiments, the set of favored locations 510 may be portions of the selected contour 520 (e.g., also referred to as mapping references as described at least with reference to FIG. 3) that, when used for aligning the metrology image 504 with the nominal contour 520, aligns the metrology image 504 with the design layout 502 with a greater accuracy than when aligned using other locations of the nominal contour 520. For example, the cost function, CF(m), may be optimized (e.g., minimized or maximized) when the metrology image 504 and the nominal contour 520 are aligned using the set of favored locations 510 of the nominal contour 520 and the corresponding locations of a contour of the metrology image 504. In some embodiments, the set of "disfavored" locations 512 may be portions of the nominal contour 520 to be avoided for performing the alignment, for example, as they tend to impair accuracy in the alignment. For example, the deviations between the set of disfavored locations 512 on the nominal contour 520 and the corresponding locations of a contour of the metrology image 504 are very large and therefore, cannot lead to an optimal cost function, CF(m).

Figure 8:
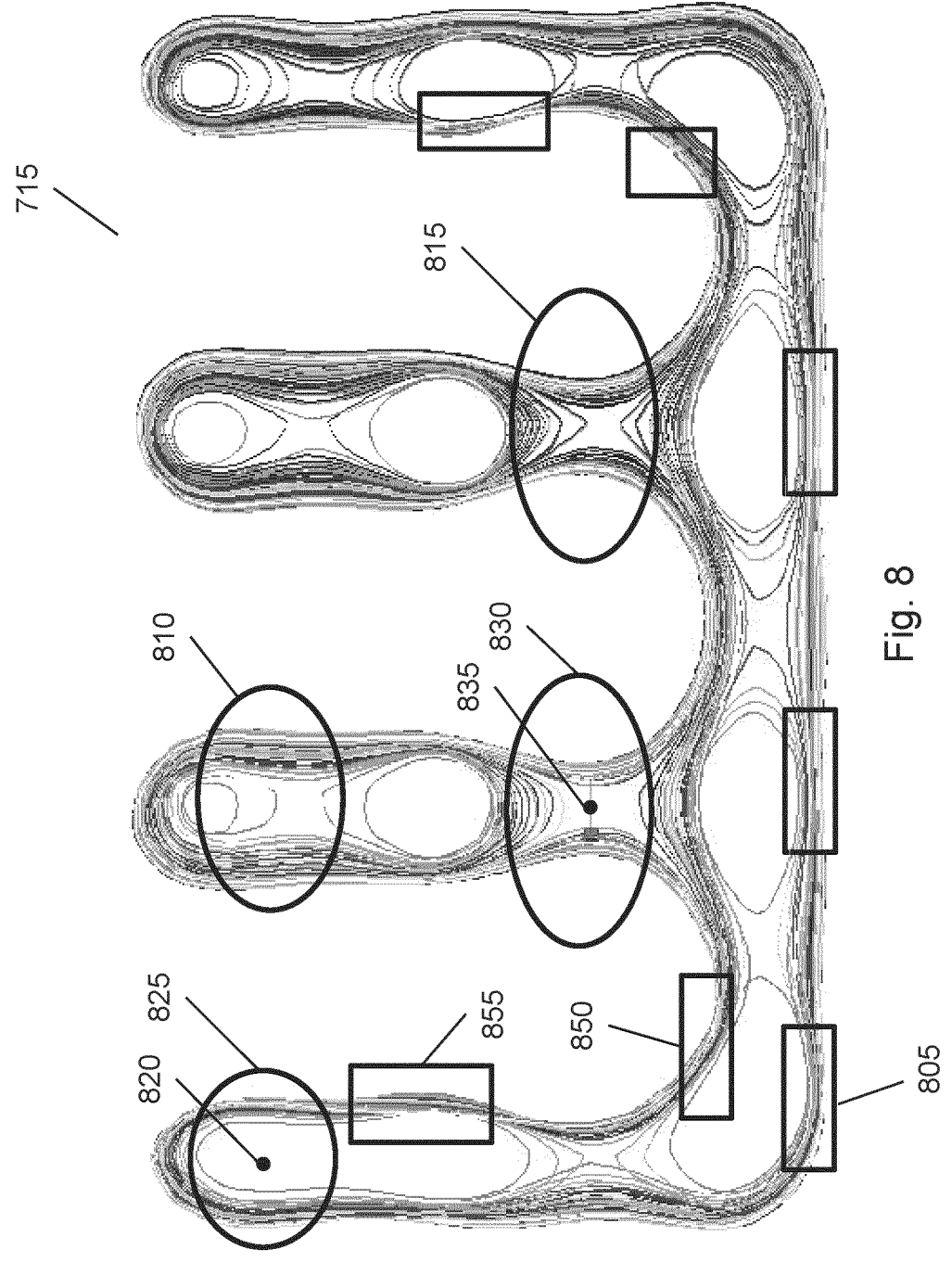
FIG. 8 shows an example of favored locations and disfavored locations of the design layout, in accordance with one or more embodiments.

In some embodiments, the contour analyzer 508 may identify the favored or disfavored locations based on one or more criteria, such as EPE, process variation range, symmetricity, or other such aspects associated with a location on the design layout 502. For example, the contour analyzer 508 may identify those locations as disfavored locations 512 at which (a) the simulated contours 715 of the design layout 502 have a process variation range satisfying (e.g., exceeding) a first process variation threshold, (b) the simulated contours 715 have an EPE satisfying (e.g., exceeding) a first EPE threshold, (c) the simulated contours 715 are asymmetric, or (d) one or more simulated contours 715 are broken. FIG. 8 shows an example of favored locations and disfavored locations of the design layout, in accordance with one or more embodiments. The locations, such as locations 810-830, enclosed in oval boxes may be identified as the set of disfavored locations 512. For example, the process variation range (e.g., a variation between a number of simulated contours 715 or a degree of non-overlap between the contours 715) at the locations 810 and 830 is above a first process variation threshold, or an EPE is above a first EPE threshold, and therefore, the locations 810 and 830 may be identified as disfavored locations. In another example, the location 815 may be identified as disfavored location as one or more simulated contours are broken. In another example, location 825 may be identified as a disfavored location as the contours do not extend symmetrically on both sides of a reference point 820 (e.g., reference point 820 may be at half of the width between the outermost contours in the location 825).

In some embodiments, the contour analyzer 508 may identify those locations as favored locations 510 at which (a) the simulated contours 715 of the design layout 502 have a process variation range satisfying (e.g., below) a second process variation threshold, (b) the simulated contours 715 have an EPE satisfying (e.g., below) a second EPE threshold, (c) the simulated contours 715 are symmetric, or other such criterion. In some embodiments, the contour analyzer 508 may identify the locations, such as locations 805, 850 and 855, enclosed in rectangular boxes as the set of favored locations 510. For example, the process variation range at the locations 805, 850 and 855 is below a second process variation threshold, or an EPE is below a second EPE threshold, and therefore, the locations 805, 850 and 855 may be identified as favored locations.

In some embodiments, a user may customize the criteria for selecting the favored locations 510 or the disfavored locations 512. For example, the user may define a criterion that even if the process variation is not below a second process variation threshold, but the contours extend symmetrically around a reference point, then the reference point may be identified as a favored point. Accordingly, the location 830 which would have been identified as a disfavored location may be identified as a favored location since the contours extend symmetrically on both sides of a reference point 835.

Figure 9:
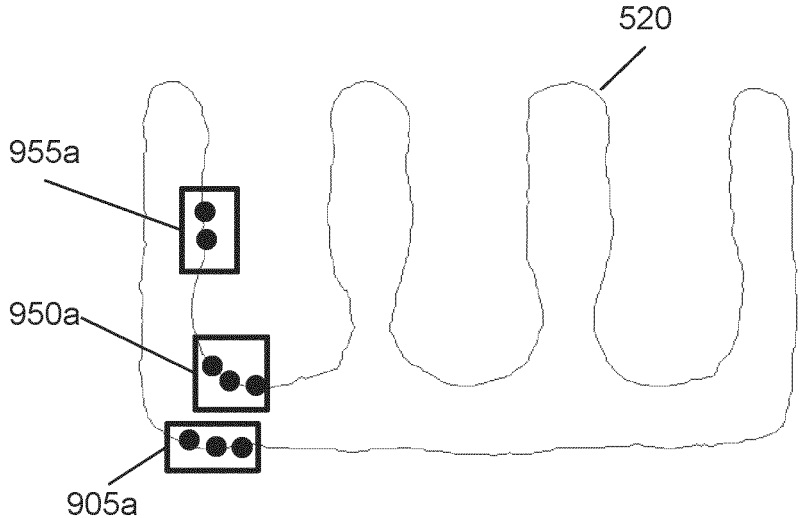
FIG. 9 shows a set of favored locations on a nominal contour of a design layout and on a metrology image for performing the alignment, in accordance with one or more embodiments.
Figure 9:
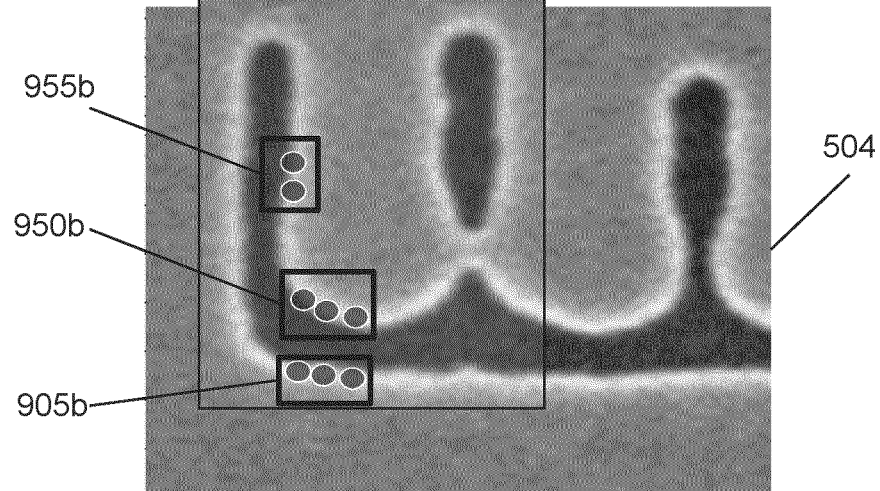

A first aligner 514 obtains information regarding the nominal contour 520 and a number of locations (e.g., the set of favored locations 510 and the set of disfavored locations 512) from the contour analyzer 508 that may be used in aligning the metrology image 504 with the design layout 502. After obtaining the information, the first aligner 514 includes the set of favored locations 510 and excludes the set of disfavored locations 512 from a list of locations that may be used for performing the alignment. The first aligner 514 may identify the set of favored locations 510 on the nominal contour 520 and the metrology image 504 as shown in FIG. 9. FIG. 9 shows a set of favored locations on a nominal contour of a design layout and on a metrology image for performing the alignment, in accordance with one or more embodiments. The first aligner 514 identifies the set of favored locations 510, such as locations 905a, 950a and 955a on the nominal contour 520 and the corresponding locations 905b, 950b and 955b on the metrology image 504. The favored locations 905a, 950a and 955a and 905b, 950b and 955b correspond to the favored locations 805, 850 and 855 of FIG. 8. After identifying the favored locations on the nominal contour 520 and the metrology image 504, the first aligner 514 may perform the alignment process, which aligns the favored locations 905b, 950b and 955b of the metrology image 504 with the favored locations 905a, 950a and 955a of the nominal contour 520, thereby aligning the metrology image 504 with the design layout 502.

Figure 10:
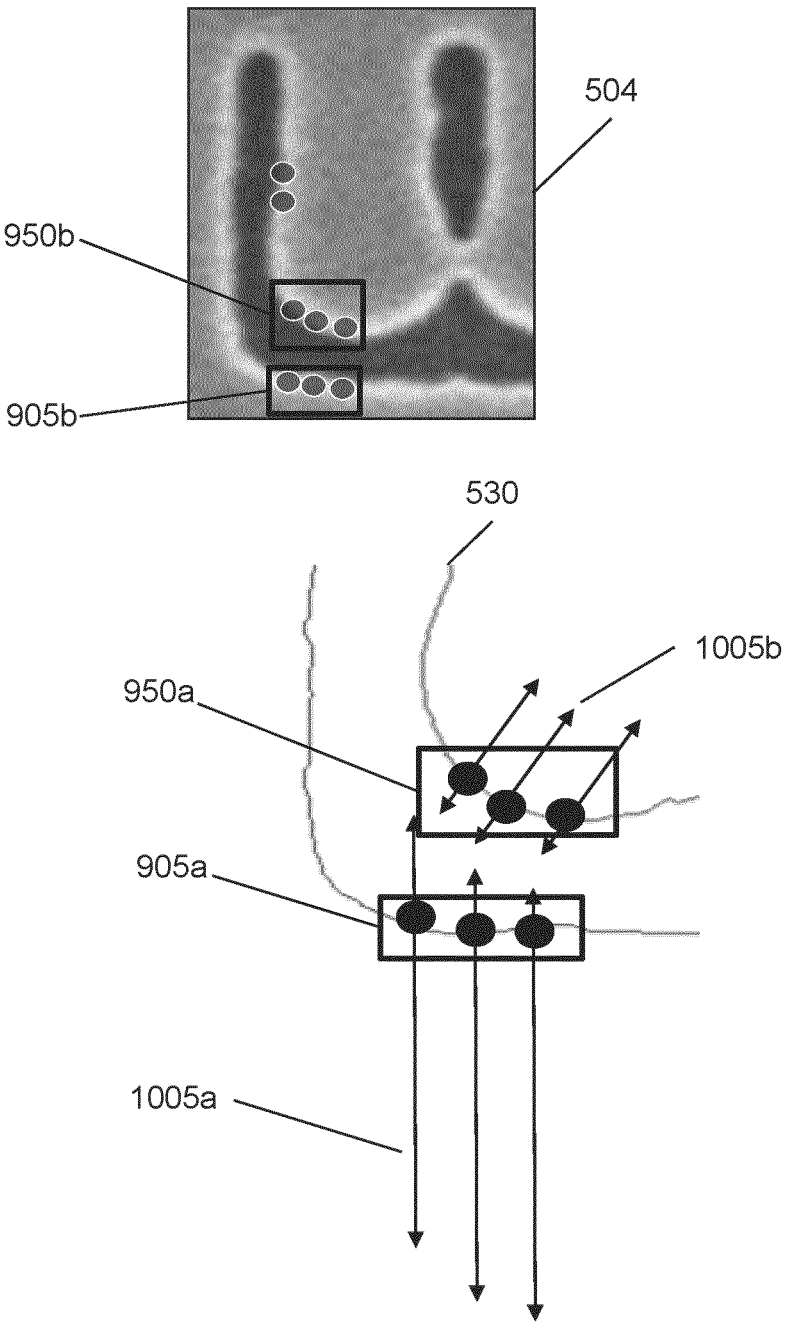
FIG. 10 shows an example of resizing a simulated contour for alignment with a metrology image, in accordance with one or more embodiments.

In some embodiments, a further alignment, referred to as "fine" alignment, may be performed to better align the metrology image 504 with the nominal contour 520. A contour resizer 524 may adjust the nominal contour 520 at one or more favored locations to match with a corresponding contour of the metrology image 504. FIG. 10 shows an example of resizing a simulated contour for alignment with a metrology image, in accordance with one or more embodiments. For example, contour resizer 524 may resize the nominal contour 520 at the favored locations 905a and 950a to reduce (e.g., minimize) a deviation between the nominal contour 520 and the contour of the metrology image 504 at the favored locations 905a and 950a so that the nominal contour 520 matches, or better aligns with, the corresponding favored locations of the contour of the metrology image 504. The contour resizer 524 may analyze the metrology image 504 to obtain one or more measurements associated with the contour at the favored locations 905b and 950b and directions 1005a and 1005b in which the nominal contour 520 is to be adjusted. The contour resizer 524 may resize the nominal contour 520 accordingly to generate an adjusted nominal contour 530.

A second aligner 528 may perform the alignment process (e.g., in a way similar to the first aligner 514) to align the metrology image 504 with the adjusted nominal contour 530, thereby aligning the metrology image 504 with the design layout 502 with a greater accuracy than the first aligner 514. In some embodiments, the fine alignment may be an optional alignment process. For example, after the metrology image 504 is aligned with the design layout 502 using the first aligner 514, it is determined whether an alignment specification is satisfied (e.g., a cost function is optimized). If the alignment specification is satisfied, the second alignment may not be performed. If the alignment specification is not satisfied, the metrology image 504 is input to the second aligner 528, which performs the second alignment such that the alignment specification is satisfied (e.g., a cost function is minimized). In one example, the cost function may be an EPE, which may be calculated based on the distances between points on the adjusted nominal contour 530 and the contour of the metrology image 504.

Figure 11:
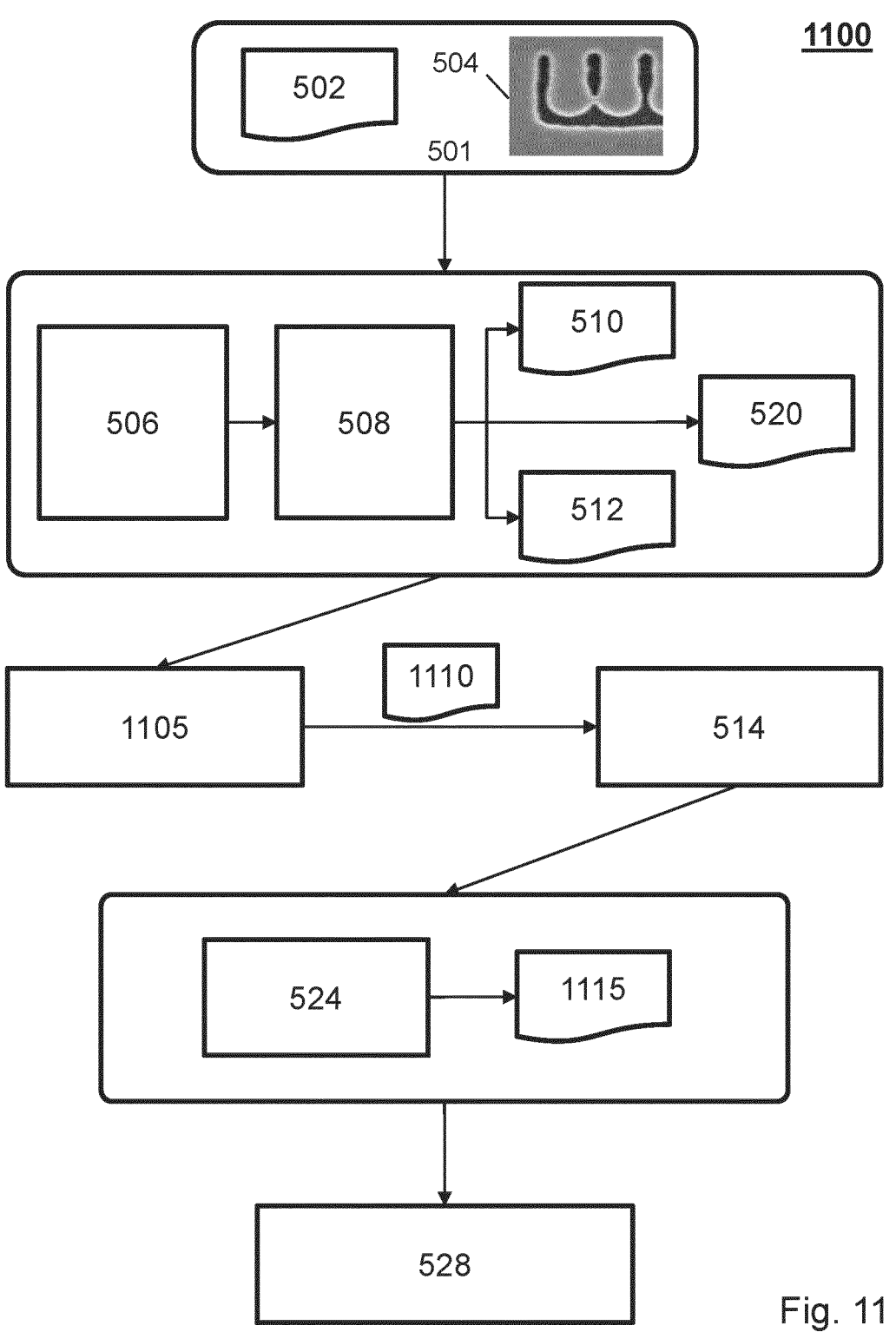
FIG. 11 shows a block diagram of another system for facilitating a simulation-assisted alignment of a metrology image with a design layout, in accordance with one or more embodiments.

After the metrology image 504 is aligned with the design layout 502 (e.g., using the first aligner 514 or the second aligner 528), one or more parameters (e.g., EPEs) of the patterned substrate are determined from the metrology image 504 aligned with the design layout 502. The design layout, the RETs, the patterning device, or the patterning process may be adjusted based on the one or more parameters so that a defect caused during the patterning process may be minimized FIG. 11 shows a block diagram of a system 100 for facilitating a simulation-assisted alignment of a metrology image with a design layout, in accordance with one or more embodiments. In some embodiments, the system 1100 is similar to the system 500 of FIG. 5 except for some differences, which are described below. The description of functionalities that are similar to the system 500 are omitted here for the sake of brevity. After the nominal contour 520, the set of favored locations 510 and the set of disfavored locations 512 are determined as described at least with reference to FIG. 5, an image generator 1105 may generate a predicted or simulated metrology image 1110 based on the nominal contour 520. The first aligner 514 may then align the metrology image 504 with the design layout 502 by aligning the metrology image 504 with the simulated metrology image 1110. Similarly, the contour resizer 524 may adjust the simulated metrology image 1110 (e.g., resize contour of the simulated metrology image 1110 at one or more favored locations) for matching the contour of the metrology image 504. The adjusted simulated metrology image 1115 may then be input to the second aligner 528 for aligning with the metrology image 504.

Figure 12:
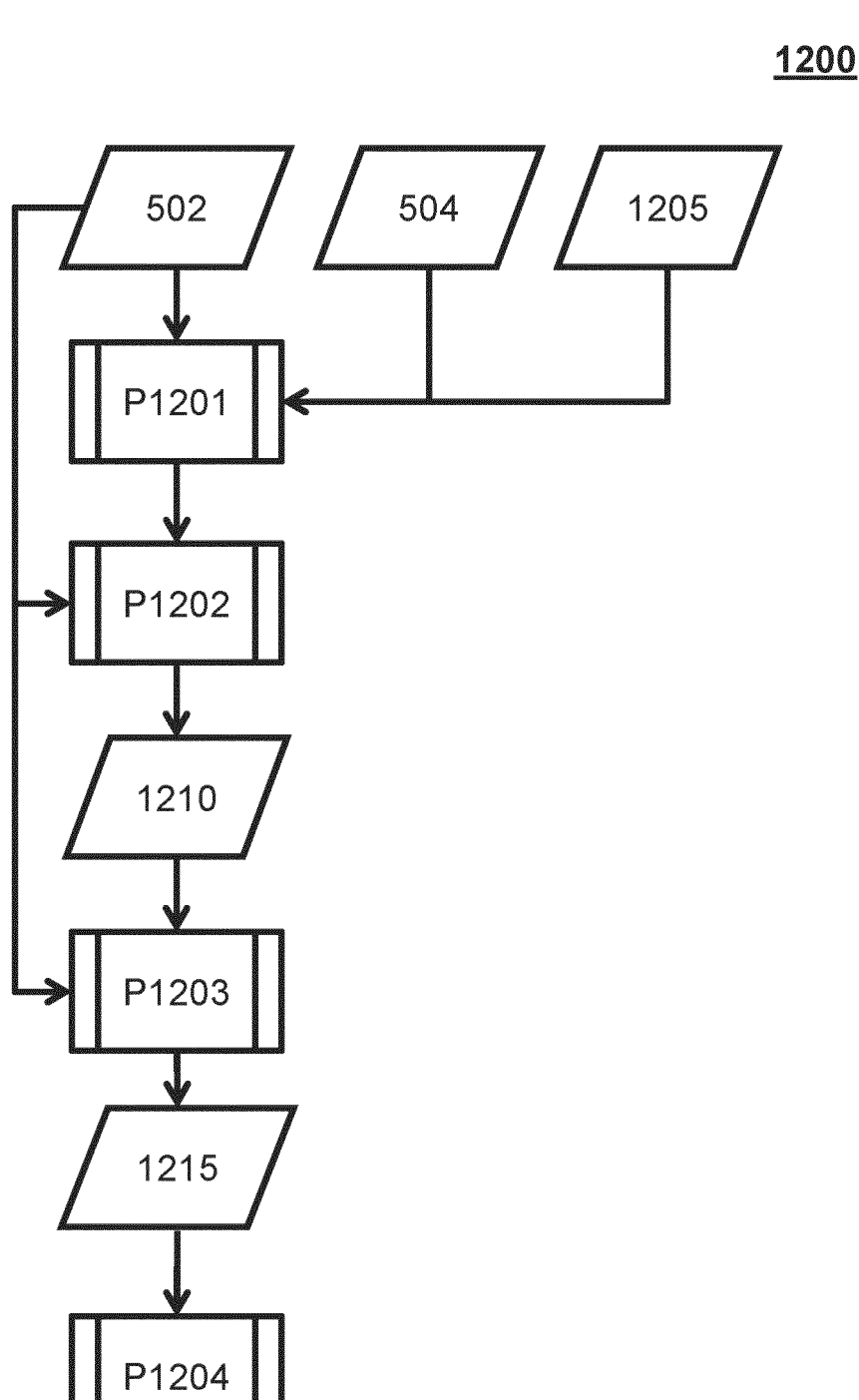
FIG. 12 is a flow diagram of a method of aligning a portion of a design layout and a metrology image obtained from a patterned substrate, in accordance with one or more embodiments.

FIG. 12 is a flow diagram of a method 1200 of aligning a portion of a design layout and a metrology image obtained from a patterned substrate, in accordance with one or more embodiments. In some embodiments, the method 1200 may be implemented using the system 500 of FIG. 5 or system 1100 of FIG. 11. In process P1201, a design layout 502 (or post-RET layout 605), a metrology image 504 and process conditions 1205 which are characteristic of the design layout 502, a patterning process, or the patterning device used in producing the patterned substrate are obtained.

In process P1202, a simulation process is performed to produce an image 1210 (e.g., an aerial, resist or etched image), which includes a number of simulated contours of the design layout 502, such as simulated contours 715 of FIG. 7. In some embodiments, each simulated contour may correspond to a different process condition 1205. In some embodiments, the simulation process (or even method 1200) may be performed substantially in real-time (e.g., upon determining the locations of the patterned substrate to be inspected by an inspection apparatus), and in concurrence with obtaining the metrology image 504 from the inspection apparatus.

In process P1203, a number of locations 1215 associated with the design layout 502 may be identified for performing an alignment with the metrology image. In some embodiments, the identified locations 1215 may include a set of "favored" locations 510 and a set of "disfavored" locations 512. In some embodiments, the set of favored locations 510 may be portions of the nominal contour 520 (e.g., one of the simulated contours 715) that, when used for aligning the metrology image 504, aligns the metrology image 504 with the design layout 502 with a greater accuracy than when aligned using other locations of the nominal contour 520. In some embodiments, the set of "disfavored" locations 512 may be portions of the nominal contour 520 to be avoided from being used for performing the alignment as they provide less or no accuracy in aligning the metrology image 504 with the design layout 502.

In process P1204, an alignment process is performed to align the metrology image 504 with the design layout 502. In some embodiments, the metrology image 504 may be aligned with the design layout 502 by aligning the metrology image 504 (or contours generated from the metrology image 504) with the nominal contour 520 of the design layout 502. The alignment process may align the metrology image 504 with the nominal contour 520 using locations other than the set of disfavored locations 512. For example, the alignment process may align the metrology image 504 with the nominal contour 520 using the set of favored locations 510. In some embodiments, the alignment process may perform a second alignment, e.g., to better align the metrology image 504 with the design layout 502. For example, in the second alignment, the nominal contour 520 may be adjusted (e.g., resized) at one or more of the favored locations to match a corresponding contour of the metrology image 504, and the metrology image 504 may then be aligned with the adjusted nominal contour 530 to obtain an alignment with a greater accuracy than the first alignment. In some embodiments, as described at least with reference to FIG. 11, the alignment process may align the metrology image 504 with the design layout using a simulated metrology image. For example, the alignment process may align the metrology image 504 with the design layout 502 by aligning the metrology image 504 with the simulated metrology image 1110. The contour resizer 524 may adjust the simulated metrology image 1110 (e.g., resize contour of the simulated metrology image 1110 at one or more favored locations) for matching the contour of the metrology image 504. The adjusted simulated metrology image 1115 may then be input to the second alignment process for performing a fine alignment with the metrology image 504.

After performing the alignment process, one or more parameters (e.g., EPEs) of the patterned substrate are determined from the metrology image 504 aligned with the design layout 502. The design layout, the RETs, the patterning device, and/or the patterning process may be adjusted based on the parameters.

Figure 13:
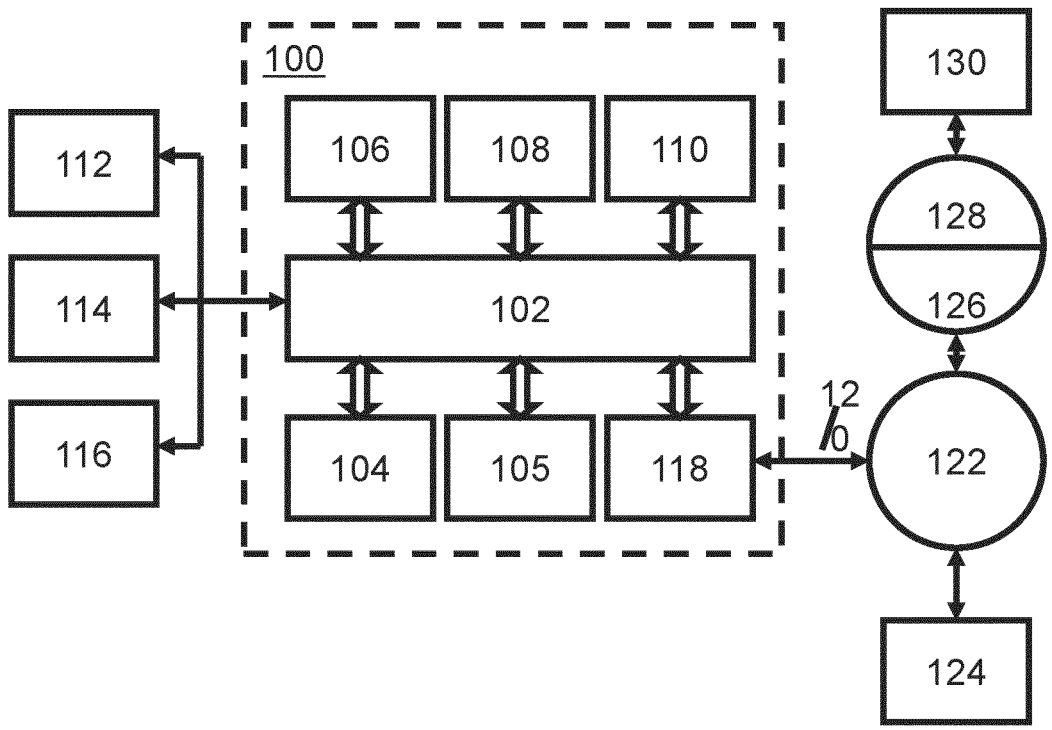
FIG. 13 is a block diagram of an example computer system, in accordance with one or more embodiments.

FIG. 13 is a block diagram that illustrates a computer system 100 which can assist in implementing the methods, flows, components, modules, systems, or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random-access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126.

ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118.

One such downloaded application may provide for a method as described herein, for example. The received code may be executed by processor 104 as it is received, and/or stored in storage device 110, or other non-volatile storage for later execution. In this manner, computer system 100 may obtain application code in the form of a carrier wave.

Although specific reference may be made in this text to the use of embodiments in the context of metrology or inspection apparatus used to inspect or measure items in association with, e.g., optical lithography and/or manufacture of ICs, it will be appreciated that the methods and apparatus described herein may be used in other applications, for example imprint lithography, the use or manufacture of integrated optical systems, the use or manufacture of guidance and detection patterns for magnetic domain memories, the use or manufacture of flat-panel displays, the use or manufacture of liquid-crystal displays (LCDs), the use or manufacture of thin film magnetic heads, etc.

The substrate referred to herein may be processed, before or after exposure/patterning, in for example a track (a tool that typically applies a layer of resist to a substrate and develops the patterned/exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed or unprocessed layers.

Although specific reference may have been made above to the use of embodiments of the disclosure in the context of optical lithography, it will be appreciated that the disclosure may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of less than about 400 nm and greater than about 20 nm, or about 365, 355, 248, 193, 157 or 126 nm), extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and/or electrostatic optical components.

While specific embodiments have been described above, it will be appreciated that the disclosure may be practiced otherwise than as described. For example, an embodiment may take the form of a computer program containing one or more sequences of machine-readable instructions describing a method as disclosed above, or a non-transitory data storage medium (e.g. semiconductor memory, magnetic or optical disk) having such a computer program stored therein, or a transitory medium having such a computer program therein. Further, the machine-readable instruction may be embodied in two or more computer programs. The two or more computer programs may be stored on one or more different data storage media.

Relative dimensions of components in drawings may be exaggerated for clarity. Within the description of drawings, the same or like reference numbers refer to the same or like components or entities, and only the differences with respect to the individual embodiments are described. As used herein, unless specifically stated otherwise, the term "or" encompasses all possible combinations, except where infeasible.

For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Embodiments of the present disclosure can be further described by the following clauses.

1. A non-transitory computer-readable medium having instructions that, when executed by a computer, cause the computer to execute a method for aligning a measured image of a pattern printed on a substrate with a design layout, the method comprising:

obtaining a design layout of a pattern to be printed on a substrate and a measured image of the pattern printed on the substrate;

performing a simulation process to generate simulated contours of the design layout for a plurality of process conditions of a patterning process;

identifying a set of disfavored locations based on the simulated contours; and performing an image alignment process to align the measured image with a selected contour of the simulated contours using locations other than the set of disfavored locations.

2. The computer-readable medium of clause 1 further comprising:

determining a parameter associated with the measured image based on the image alignment process, and adjusting at least one of the design layout, a patterning device having the design layout, or the patterning process, based on the parameter.

3. The computer-readable medium of clause 1, wherein performing the simulation process includes:

generating each of the simulated contours for a different process condition.

4. The computer-readable medium of clause 3, wherein each of the process conditions includes one or more of a lens effect of an apparatus used to print the pattern on the substrate or a resist effect of a resist on the substrate.

5. The computer-readable medium of clause 1, wherein performing the simulation process includes:

obtaining a mask design layout by performing an optimal proximity correction process on the design layout, and generating the simulated contours based on the design layout and the mask design layout.

6. The computer-readable medium of clause 1, wherein the selected contour corresponds to a nominal process condition.

7. The computer-readable medium of clause 1, wherein identifying the set of disfavored locations includes:

identifying a location on the simulated contours as a disfavored location based on (a) a deviation between the location and a corresponding location on a contour of the measured image exceeding a first threshold, (b) a process condition variation at the location exceeding a second threshold, (c) a determination that the simulated contours are asymmetric at the location, or (d) a determination that one or more of the simulated contours are broken at the location.

8. The computer-readable medium of clause 1, wherein the method further comprises:

identifying a set of favored locations on the simulated contours based on (a) a deviation between a location on the simulated contours and corresponding location on a contour of the measured image satisfying a third threshold, (b) a process condition variation at the location satisfying a fourth threshold, or (c) a determination that the simulated contours are symmetric the location where, and wherein performing the image alignment process includes: performing the image alignment process between the measured image and the selected contour at a plurality of locations on the simulated contours, wherein the plurality of locations includes the set of favored locations.

9. The computer-readable medium of clause 8, wherein performing the image alignment process includes:

excluding the set of disfavored locations from the plurality of locations for the image alignment process.

10. The computer-readable medium of clause 1 further comprising:

performing a measurement to obtain a deviation between the selected contour and a contour of the measured image at a set of favored locations, and adjusting the selected contour at the set of favored locations for reducing the deviation, wherein the adjusting generates an adjusted selected contour.

11. The computer-readable medium of clause 10 further comprising:

performing the image alignment process between the measured image and the adjusted selected contour at the set of favored locations.

12. The computer-readable medium of clause 10 further comprising:

performing a simulation process to generate a predicted measured image from the adjusted selected contour, and performing the image alignment process between the measured image and the predicted measured image at the set of favored locations.

13. The computer-readable medium of clause 1 further comprising:

performing a simulation process to generate a predicted measured image from the selected contour, and performing the image alignment process between the measured image and the predicted measured image at a set of favored locations.

14. The computer-readable medium of clause 13 further comprising:

adjusting the predicted measured image to reduce a deviation between a contour of the predicted measured image and a contour of the measured image at the set of favored locations, wherein the adjusting generates an adjusted predicted measured image, and performing the image alignment process between the measured image and the adjusted predicted measured image at the set of favored locations.

15. The computer-readable medium of clause 1, wherein the measured image is obtained using an image capture device.

16. A non-transitory computer-readable medium having instructions that, when executed by a computer, cause the computer to execute a method for aligning a measured image of a pattern printed on a substrate with a design layout, the method comprising:

obtaining a design layout of a pattern to be printed on a substrate and a measured image of the pattern printed on the substrate;

performing a simulation process to generate simulated results of the design layout for a plurality of process conditions of a patterning process;

identifying a set of disfavored locations based on the simulated results; and performing an image alignment process between the measured image and the design layout by aligning the measured image with a selected result of the simulated results using locations other than the set of disfavored locations.

17. The computer-readable medium of clause 16, wherein the simulated results include simulated contours of the design layout.

18. The computer-readable medium of clause 16, wherein the selected result is a selected contour of the design layout corresponding to a nominal process condition.

19. The computer-readable medium of clause 16, wherein the method further includes:

performing a simulation process to generate a predicted measured image from the selected result, and wherein performing the image alignment process includes aligning the measured image with the predicted measured image using locations at a set of favored locations, the set of favored locations excluding the set of disfavored locations.

20. The computer-readable medium of clause 19 further comprising:

adjusting the predicted measured image to reduce a deviation between a contour of the predicted measured image and a contour of the measured image at the set of favored locations, wherein the adjusting generates an adjusted predicted measured image, and performing the image alignment process between the measured image and the adjusted predicted measured image at the set of favored locations.

21. A non-transitory computer-readable medium having instructions that, when executed by a computer, cause the computer to execute a method for aligning a measured image of a pattern printed on a substrate with a design layout, the method comprising:

obtaining a design layout of a pattern to be printed on a substrate and a measured image of the pattern printed on the substrate;

performing a simulation process to generate simulated contours of the design layout for a plurality of process conditions of a patterning process;

identifying a set of disfavored locations based on the simulated contours;

performing a simulation process to generate a predicted measured image from a selected contour of the simulated contours; and performing an image alignment process to align the measured image with the predicted measured image using locations other than the set of disfavored locations.

22. The computer-readable medium of clause 21 further comprising:

adjusting the selected contour for reducing a deviation between the selected contour and a contour of the measured image at a set of favored locations, wherein the adjusting generates an adjusted predicted measured image.

23. The computer-readable medium of clause 22 further comprising:

performing the image alignment process between the measured image and the adjusted predicted measured image at the set of favored locations.

24. A method for aligning a measured image of a pattern printed on a substrate with a design layout, the method comprising:

obtaining a design layout of a pattern to be printed on a substrate and a measured image of the pattern printed on the substrate;

performing a simulation process to generate simulated contours of the design layout for a plurality of process conditions of a patterning process;

identifying a set of disfavored locations based on the simulated contours; and performing an image alignment process to align the measured image with a selected contour of the simulated contours using locations other than the set of disfavored locations.

25. The method of clause 24, wherein performing the simulation process includes: generating each of the simulated contours for a different process condition.

26. The method of clause 25, wherein a process condition of the process conditions includes one or more of lens effect of an apparatus used to print the pattern on the substrate or a resist effect on the substrate.

27. The method of clause 24, wherein performing the simulation process includes:

performing an optimal proximity correction process on the design layout to generate a corrected design layout, and generating the simulated contours of the corrected design layout.

28. The method of clause 24, wherein performing the image alignment process includes:

identifying one of the simulated contours corresponding to a specified process condition as the selected contour.

29. The method of clause 24, wherein identifying the set of disfavored locations includes:

identifying a location on the simulated contours as a disfavored location based on (a) a deviation between the location and a corresponding location on a contour of the measured image exceeding a first threshold, (b) a process condition variation at the location exceeding a second threshold, (c) a determination that the simulated contours are asymmetric at the location, or (d) a determination that one or more of the simulated contours are broken at the location.

30. The method of clause 24, wherein the method further includes:

identifying a set of favored locations on the simulated contours based on (a) a deviation between a location on the simulated contours and corresponding location on a contour of the measured image satisfying a third threshold, (b) a process condition variation at the location satisfying a fourth threshold, or (c) a determination that the simulated contours are symmetric the location where, and wherein performing the image alignment process includes: performing the image alignment process between the measured image and the selected contour at a plurality of locations on the simulated contours, wherein the plurality of locations includes the set of favored locations.

31. The method of clause 30, wherein performing the image alignment process includes:

excluding the set of disfavored locations from the plurality of locations for the image alignment process.

32. The method of clause 24 further comprising:

performing a measurement to obtain a deviation between the selected contour and a contour of the measured image at a set of favored locations, and adjusting the selected contour at the set of favored locations for reducing the deviation, wherein the adjusting generates an adjusted selected contour.

33. The method of clause 32 further comprising:

performing the image alignment process between the measured image and the adjusted selected contour at the set of favored locations.

34. The method of clause 32 further comprising:

performing a simulation process to generate a predicted measured image from the adjusted selected contour, and performing the image alignment process between the measured image and the predicted measured image at the set of favored locations.

35. The method of clause 24 further comprising:

performing a simulation process to generate a predicted measured image from the selected contour, and performing the image alignment process between the measured image and the predicted measured image at a set of favored locations.

36. The method of clause 35 further comprising:

adjusting the predicted measured image to reduce a deviation between a contour of the predicted measured image and a contour of the measured image at the set of favored locations, wherein the adjusting generates an adjusted predicted measured image, and performing the image alignment process between the measured image and the adjusted predicted measured image at the set of favored locations.

37. The method of clause 24, wherein the measured image is obtained using an image capture device.

38. An apparatus comprising:

a memory storing a set of instructions; and at least one processor configured to execute the set of instructions to cause the apparatus to perform a method as described in any of clauses 24-37.

39. An inspection system comprising:

An image capturing system;

a memory storing a set of instructions; and at least one processor configured to execute the set of instructions to cause the apparatus to perform a method as described in any of clauses 24-37.

The descriptions above are intended to be illustrative, not limiting. Thus, it will be apparent to one skilled in the art that modifications may be made to the disclosure as described without departing from the scope of the claims set out below.

The invention claimed is:

1. A non-transitory computer-readable medium having instructions that, when executed by a computer system, are configured to cause the computer system to at least:

obtain a design layout of a pattern to be printed on a substrate and a measured image of the pattern printed on the substrate;

perform a simulation process to generate simulated contours of the design layout for a plurality of process conditions of a patterning process;

identify a set of disfavored locations based on the simulated contours, wherein the identification of a disfavored location is based on (a) a deviation between the location and a corresponding location on a contour of the measured image meeting or crossing a first threshold, (b) a process condition variation at the location meeting or crossing a second threshold, (c) a determination that the simulated contours are asymmetric at the location, or (d) a determination that one or more of the simulated contours are broken at the location; and perform an image alignment process to align the measured image with a selected contour of the simulated contours using locations other than the set of disfavored locations.

2. The computer-readable medium of claim 1, wherein the instructions are further configured to cause the computer system to:

determine a parameter associated with the measured image based on the image alignment process, and adjust, based on the parameter, at least one selected from: the design layout, a patterning device having the design layout, or the patterning process.

3. The computer-readable medium of claim 1, wherein the instructions configured to cause the computer system to perform the simulation process are further configured to cause the computer system to generate each of the simulated contours for a different process condition.

4. The computer-readable medium of claim 3, wherein each of the process conditions includes a lens effect of an apparatus used to print the pattern on the substrate and/or a resist effect of a resist on the substrate.

5. The computer-readable medium of claim 1, wherein the instructions configured to cause the computer system to perform the simulation process are further configured to cause the computer system to:

obtain a mask design layout by performing an optimal proximity correction process on the design layout, and generate the simulated contours based on the design layout and the mask design layout.

6. The computer-readable medium of claim 1, wherein the selected contour corresponds to a nominal process condition.

7. The computer-readable medium of claim 1, wherein the instructions are further configured to cause the computer system to: identify a set of favored locations on the simulated contours based on (a) a deviation between a location on the simulated contours and corresponding location on a contour of the measured image satisfying a third threshold, (b) a process condition variation at a location on a contour satisfying a fourth threshold, or (c) a determination that the simulated contours are symmetric at a location on the simulated contours, and wherein the instructions configured to cause the computer system to perform the alignment process are further configured to cause the computer system to perform the image alignment process between the measured image and the selected contour at a plurality of locations on the simulated contours, wherein the plurality of locations includes the set of favored locations.

8. The computer-readable medium of claim 7, wherein the instructions configured to cause the computer system to perform the alignment process are further configured to cause the computer system to exclude the set of disfavored locations from the plurality of locations for the image alignment process.

9. The computer-readable medium of claim 1, wherein the instructions are further configured to cause the computer system to:

perform a measurement to obtain a deviation between the selected contour and a contour of the measured image at a set of favored locations, and adjust the selected contour at the set of favored locations for reducing the deviation, wherein the adjustment generates an adjusted selected contour.

10. The computer-readable medium of claim 9, wherein the instructions are further configured to cause the computer system to perform the image alignment process between the measured image and the adjusted selected contour at the set of favored locations.

11. The computer-readable medium of claim 9, wherein the instructions are further configured to cause the computer system to:

perform a simulation process to generate a predicted measured image from the adjusted selected contour, and perform the image alignment process between the measured image and the predicted measured image at the set of favored locations.

12. The computer-readable medium of claim 1, wherein the instructions are further configured to cause the computer system to:

perform a simulation process to generate a predicted measured image from the selected contour, and perform the image alignment process between the measured image and the predicted measured image at a set of favored locations.

13. The computer-readable medium of claim 12, wherein the instructions are further configured to cause the computer system to:

adjust the predicted measured image to reduce a deviation between a contour of the predicted measured image and a contour of the measured image at the set of favored locations, wherein the adjustment generates an adjusted predicted measured image, and perform the image alignment process between the measured image and the adjusted predicted measured image at the set of favored locations.

14. The computer-readable medium of claim 1, wherein the measured image is obtained using an image capture device.

15. An apparatus comprising:

a memory storing a set of instructions; and at least one processor configured to execute the set of instructions to cause the apparatus to at least:

obtain a design layout of a pattern to be printed on a substrate and a measured image of the pattern printed on the substrate;

perform a simulation process to generate simulated contours of the design layout for a plurality of process conditions of a patterning process;

identify a set of favored locations based on the simulated contours, wherein the identification of a favored location is based on (a) a deviation between a location on the simulated contours and corresponding location on a contour of the measured image satisfying a third threshold, (b) a process condition variation at a location on a contour satisfying a fourth threshold, or (c) a determination that the simulated contours are symmetric at a location on the simulated contours; and perform an image alignment process to align the measured image with a selected contour of the simulated contours using locations including the set of favored locations.

16. A non-transitory computer-readable medium having instructions that, when executed by a computer system, cause the computer system to at least:

obtain a design layout of a pattern to be printed on a substrate and a measured image of the pattern printed on the substrate;

perform a simulation process to generate simulated results of the design layout for a plurality of process conditions of a patterning process;

identify a set of locations for image alignment based on the simulated results, wherein the identification of a location to be within the set of locations is based on (a) a deviation between the location and a corresponding location on a contour of the measured image meeting or crossing a first threshold, (b) a process condition variation at the location meeting or crossing a second threshold, (c) a determination that simulated contours of the simulated results are asymmetric at the location, (d) a determination that simulated contours of the simulated results are symmetric at the location, or (e) a determination that one or more of simulated contours of the simulated results are broken at the location; and perform an image alignment process between the measured image and the design layout by aligning the measured image with a selected result of the simulated results using the set of locations.

17. The computer-readable medium of claim 16, wherein the instructions are further configured to cause the computer system to perform a simulation process to generate a predicted measured image from the selected result, and wherein the instructions configured to cause the computer system to perform the image alignment process are further configured to cause the computer system to align the measured image with the predicted measured image using the set of locations.

18. The computer-readable medium of claim 17, wherein the instructions are further configured to cause the computer system to:

adjust the predicted measured image to reduce a deviation between a contour of the predicted measured image and a contour of the measured image at the set of locations, wherein the adjustment generates an adjusted predicted measured image, and perform the image alignment process between the measured image and the adjusted predicted measured image at the set of locations.

19. The computer-readable medium of claim 16, wherein the instructions are further configured to cause the computer system to:

determine a parameter associated with the measured image based on the image alignment process, and adjust, based on the parameter, at least one selected from: the design layout, a patterning device having the design layout, or the patterning process.

20. The computer-readable medium of claim 19, wherein the instructions are further configured to cause the computer system to:

determine a parameter associated with the measured image based on the image alignment process, and adjust, based on the parameter, at least one selected from:
the design layout, a patterning device having the design
layout, or the patterning process.

\* \* \* \* \*